United States Patent
Loftus et al.

(10) Patent No.: US 9,383,416 B2
(45) Date of Patent: Jul. 5, 2016

(54) SYSTEM AND METHOD FOR TESTING VEHICLE TRACTION BATTERY COMPONENTS

(71) Applicant: FORD GLOBAL TECHNOLOGIES, LLC, Dearborn, MI (US)

(72) Inventors: Michael Edward Loftus, Northville, MI (US); James Lawrence Swoish, Northville, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 546 days.

(21) Appl. No.: 14/015,335

(22) Filed: Aug. 30, 2013

(65) Prior Publication Data

US 2015/0066416 A1    Mar. 5, 2015

(51) Int. Cl.
   *G01R 31/36*    (2006.01)
   *G01R 31/28*    (2006.01)
   *G01R 31/04*    (2006.01)

(52) U.S. Cl.
   CPC .......... *G01R 31/3648* (2013.01); *G01R 31/045* (2013.01); *G01R 31/2846* (2013.01)

(58) Field of Classification Search
   CPC .......................... G01R 31/2846; G01R 31/045
   See application file for complete search history.

(56) References Cited

U.S. PATENT DOCUMENTS

| | | | |
|---|---|---|---|
| 4,272,716 A * | 6/1981 | Etienne | B60L 11/1803 320/130 |
| 7,688,023 B2 | 3/2010 | Yoon et al. | |
| 7,768,235 B2 | 8/2010 | Tae et al. | |
| 8,134,338 B2 | 3/2012 | Choi | |
| 2009/0243554 A1 | 10/2009 | Gu et al. | |
| 2011/0054816 A1 | 3/2011 | Prada et al. | |
| 2013/0326241 A1* | 12/2013 | Yu | G06F 1/26 713/300 |

FOREIGN PATENT DOCUMENTS

| | | | |
|---|---|---|---|
| CN | 100529778 C | * | 8/2009 |
| CN | 101762800 A | * | 6/2010 |
| CN | 202205862 U | * | 4/2012 |
| CN | 203084180 U | * | 7/2013 |
| JP | 2007280872 A | * | 10/2007 |

* cited by examiner

*Primary Examiner* — Alexander Satanovsky
*Assistant Examiner* — John Kuan
(74) *Attorney, Agent, or Firm* — David Kelley; Brooks Kushman P.C.

(57) ABSTRACT

A traction battery connection simulator is disclosed comprising a plurality of power supplies connected to simulate a traction battery and a plurality of switching devices that selectively connect the power supplies to a controller under test. The simulator further comprises a controller programmed to selectively connect at least one of power supplies to the controller under test for a predetermined period of time before connecting remaining power supplies. The controller may also be programmed to disconnect at least one power supplies from the controller under test for a predetermined period of time before disconnecting remaining power supplies. Voltages associated with each power supply and currents through each switching device may be compared to corresponding predetermined ranges. An indicator may be set in response to at least one of the voltages and currents being outside of a corresponding predetermined range.

17 Claims, 6 Drawing Sheets

SYSTEM AND METHOD FOR TESTING VEHICLE TRACTION BATTERY COMPONENTS

TECHNICAL FIELD

This application relates to testing vehicle traction battery charging and control system component operation in response to connecting and/or disconnecting the traction battery controller using one or more multiple pin connectors.

BACKGROUND

A high-voltage traction battery may be used for hybrid and electric vehicle applications. The high-voltage traction battery is typically connected to a battery controller that has specialized circuitry to measure each cell of a high-voltage string. During manufacturing, the connector of the controller must be physically connected to the battery cells via harnesses and connectors. Pins within the connectors mate to complete the cell measurement circuits. These connections are made when the circuits are fully powered which is referred to as a hot plug connection. Likewise, during service, the connector of the battery controller may be disconnected and reconnected when the circuits are fully powered.

The order in which the connector pins actually mate is random due to several factors including variations in pin length, seating depth, and angle of connector insertion/extraction. There are patterns of connection/disconnection order that may cause momentary unpredictable voltage conditions within the battery controller circuitry including overvoltage and reverse voltage biasing of components. The stressed components may become immediately inoperative or may be compromised such that they do not meet design durability goals.

A battery controller's susceptibility to this failure mode may not be evident even after several connections due to the unpredictable nature of the connections. A relatively small number of connections may not have included the most stressful pin mating order. Mildly stressful connections may result in cumulative component stress that allows the battery controller to function until a sufficient number of mildly stressful connections/disconnections are performed.

SUMMARY

A traction battery connection simulator includes a plurality of power supplies connected to simulate a traction battery and a plurality of switching devices that selectively connect the plurality of power supplies in a programmed sequence to a controller under test. The connection simulator includes at least one controller programmed to operate the plurality of switching devices to selectively connect at least one of the plurality of power supplies to the controller under test for a predetermined period of time before connecting remaining power supplies. The controller may be further programmed to compare voltages associated with each power supply and currents through each switching device to corresponding predetermined ranges. The controller may be further programmed to communicate with the controller under test to receive voltage data that are voltage measurements associated with each power supply. The connection simulator may include a plurality of current sensors for measuring a current passing through each of the plurality of switching devices and the at least one controller may be further programmed to measure current data from the plurality of current sensors. The controller may be further programmed to, when all of the plurality of power supplies are connected to the controller under test, operate the plurality of switching devices so that at least one of the plurality of power supplies is not selectively connected for another predetermined period of time before operating the plurality of switching devices such that none of the plurality of power supplies are connected. Two of the plurality of power supplies may be connected for the predetermined period of time. The power supplies may have an output voltage that is adjustable.

A method for testing a traction battery controller includes connecting at least one of a plurality of power supplies to the traction battery controller for a predetermined amount of time using a programmed controller, and connecting, after the predetermined amount of time, remaining power supplies to the traction battery controller using the programmed controller; and comparing voltages and currents associated with each power supply to corresponding predetermined ranges. Connecting the plurality of power supplies may comprise controlling corresponding switching devices using the programmed controller. Voltage data may be received from the traction battery controller containing voltages associated with each power supply. For the predetermined amount of time, two of the plurality of power supplies may be connected. The method may further comprise setting an indicator in response to at least one of the voltages and currents being outside of a corresponding predetermined range. The method may further comprise (i) connecting all of the plurality of power supplies to the traction battery controller, (ii) disconnecting at least one of the plurality of power supplies from the traction battery controller for another predetermined amount of time and (iii) disconnecting remaining power supplies after the another predetermined amount of time, using the programmed controller.

A traction battery connection simulator includes at least one power supply connected to simulate a traction battery and a plurality of switching devices that selectively apply power from the power supply to combinations of pins of a connector electrically coupled to a controller under test. The connection simulator includes at least one controller programmed to operate the plurality of switching devices to connect power to at least one of the pins of the connector for a predetermined period of time before connecting power to remaining pins. The controller may be programmed or configured to connect power to various combinations of pins associated with the controller under test. The controller may be further programmed to compare voltages and currents associated with the various combinations to corresponding predetermined ranges. The controller may be further programmed to, after operating the plurality of switching devices to connect power to all pins of the connector, operate the switching devices to selectively disconnect power to various combinations of pins connected to the controller under test for another predetermined period of time before disconnecting power to all pins.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
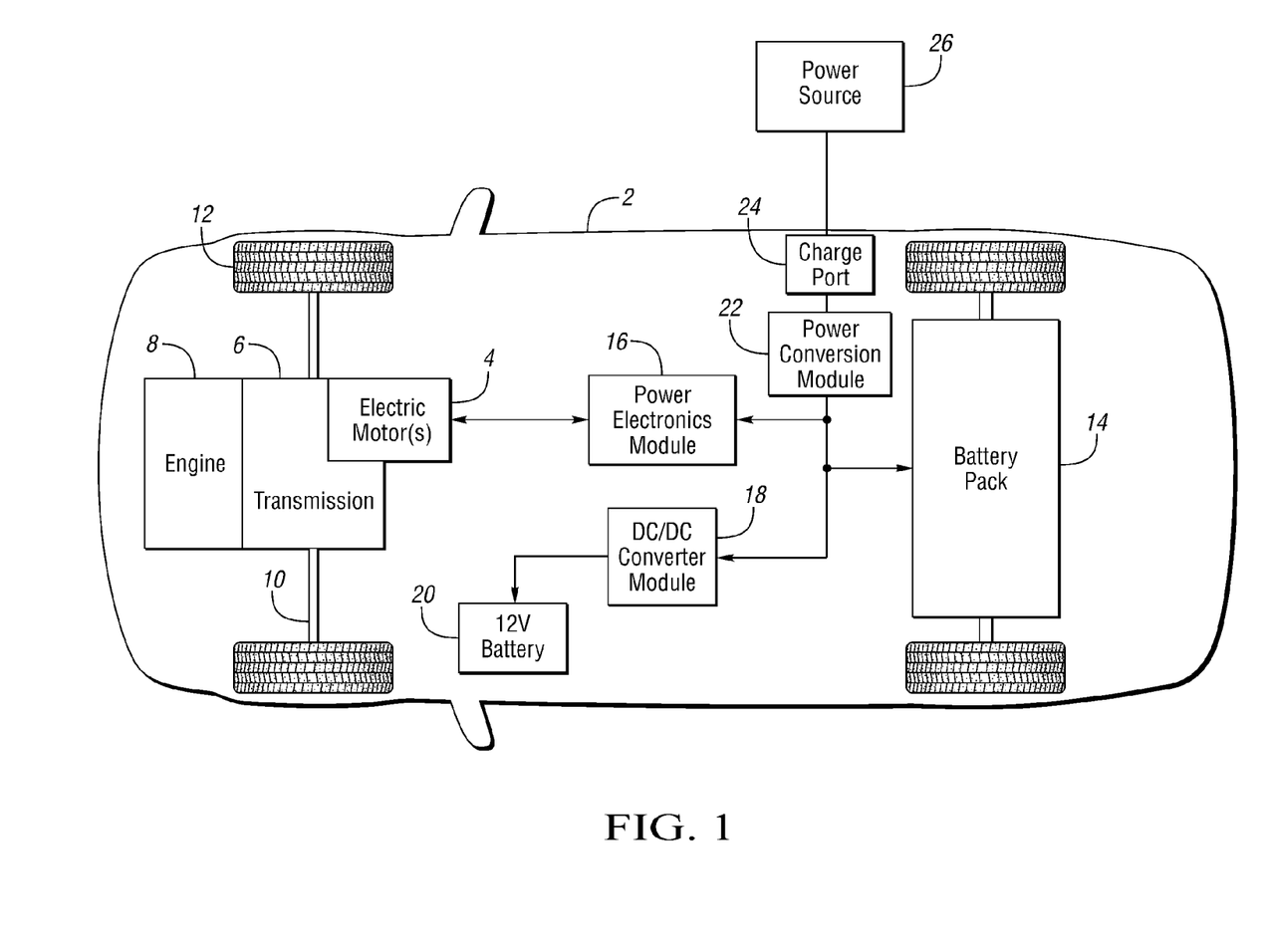
FIG. 1 is a diagram of a plug-in hybrid vehicle illustrating a typical usage of a traction battery.

FIG. 1 depicts a typical plug-in hybrid-electric vehicle. A typical plug-in hybrid-electric vehicle 2 may comprise one or more electric machines operable as motors 4 mechanically connected to a hybrid transmission 6. In addition, the hybrid transmission 6 is mechanically connected to an engine 8. The hybrid transmission 6 may also be mechanically connected to a drive shaft 10 that is mechanically connected to the wheels 12. The electric motors 4 can provide propulsion and deceleration capability when the engine 8 is turned on or off. The electric motors 4 may also act as generators and can provide fuel economy benefits by recovering energy that would normally be lost as heat in the friction braking system. The electric motors 4 may also reduce pollutant emissions since the hybrid electric vehicle 2 may be operated in electric mode under certain conditions.

The battery pack 14 stores energy that can be used by the electric motors 4. A vehicle battery pack 14 typically provides a high voltage DC output. The battery pack or traction battery 14 is electrically connected to a power electronics module 16. The power electronics module 16 is also electrically connected to the electric motors 4 and provides the ability to bi-directionally transfer energy between the battery pack 14 and the electric motors 4. For example, a typical traction battery 14 may provide a DC voltage while the electric motors 4 may require a three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14. While the representative embodiment illustrated depicts a plug-in hybrid-electric vehicle, those of ordinary skill in the art will recognize that various embodiments may be utilized with other types of electric and hybrid vehicles having a traction battery. For example, the systems and methods described herein are equally applicable to a pure electric vehicle or any other device using a traction battery or battery pack.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads, such as compressors and electric heaters, may be connected directly to the high-voltage bus from the battery pack 14. In a typical vehicle, the low voltage systems are electrically connected to a 12V battery 20. An all-electric vehicle may have a similar architecture but without the engine 8.

The battery pack 14 may be recharged by an external power source 26. The external power source 26 may provide AC or DC power to the vehicle 2 by electrically connecting through a charge port 24. The charge port 24 may be any type of port configured to transfer power from the external power source 26 to the vehicle 2. The charge port 24 may be electrically connected to a power conversion module 22. The power conversion module may condition the power from the external power source 26 to provide the proper voltage and current levels to the battery pack 14. In some applications, the external power source 26 may be configured to provide the proper voltage and current levels to the battery pack 14 and the power conversion module 22 may not be necessary. The functions of the power conversion module 22 may reside in the external power source 26 in some applications.

Figure 2:
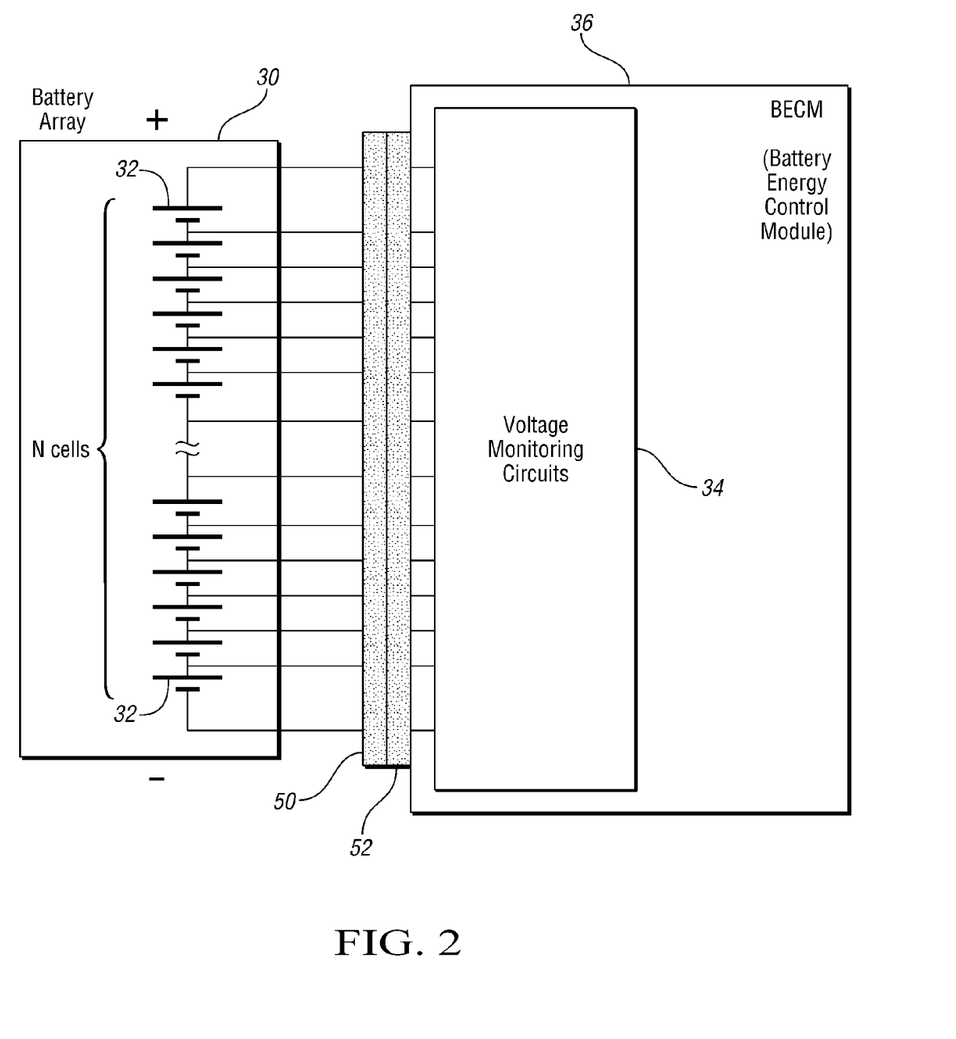
FIG. 2 is a diagram showing a battery array plugged into a battery controller.

Battery packs may be constructed from a variety of chemical formulations. Typical battery pack chemistries are lead acid, nickel-metal hydride (NIMH) or Lithium-Ion. FIG. 2 shows a typical battery pack 30 in a simple series configuration of N battery cells 32. Other battery packs, however, may be composed of any number of individual battery cells connected in series or parallel or some combination thereof. A typical system may have a one or more controllers, such as a Battery Energy Control Module (BECM) 36 that monitors and controls the performance of the battery pack 30. The BECM 36 may monitor several battery pack level characteristics such as pack current, pack voltage and pack temperature. The BECM 36 may have non-volatile memory such that data may be retained when the BECM is in an off condition. Retained data may be available upon the next key cycle.

In addition to the pack level characteristics, there may be battery cell level characteristics that are measured and monitored. For example, the terminal voltage, current, and temperature of each cell may be measured. A battery controller 36 may include voltage monitoring circuits 34 to measure the voltage across the terminals of each of the N cells 32 of the battery pack 30. The voltage monitoring circuits 34 may be a network of resistors and capacitors configured to provide proper scaling and filtering of the cell voltage signals. The voltage monitoring circuits 34 may also include other components for properly sampling the cell voltages and converting the voltages to digital values for use in a microprocessor. The voltage monitoring circuits 34 may also provide isolation so that high-voltages will not damage other circuitry with the BECM 36.

The BECM 36 may be connected to a battery pack 30 by one or more connectors. FIG. 2 shows a fully mated battery connection system. In this example, a connection to each terminal of the cells 32 is electrically connected to a battery-side connector 50. The battery-side connector 50 may have pins or recesses for mating with a controller-side connector 52 which has complementary recesses or pins. When the battery-side connector 50 is attached to the controller-side connector, the voltage monitoring circuits 34 are electrically connected to the battery cells 32.

Figure 3:
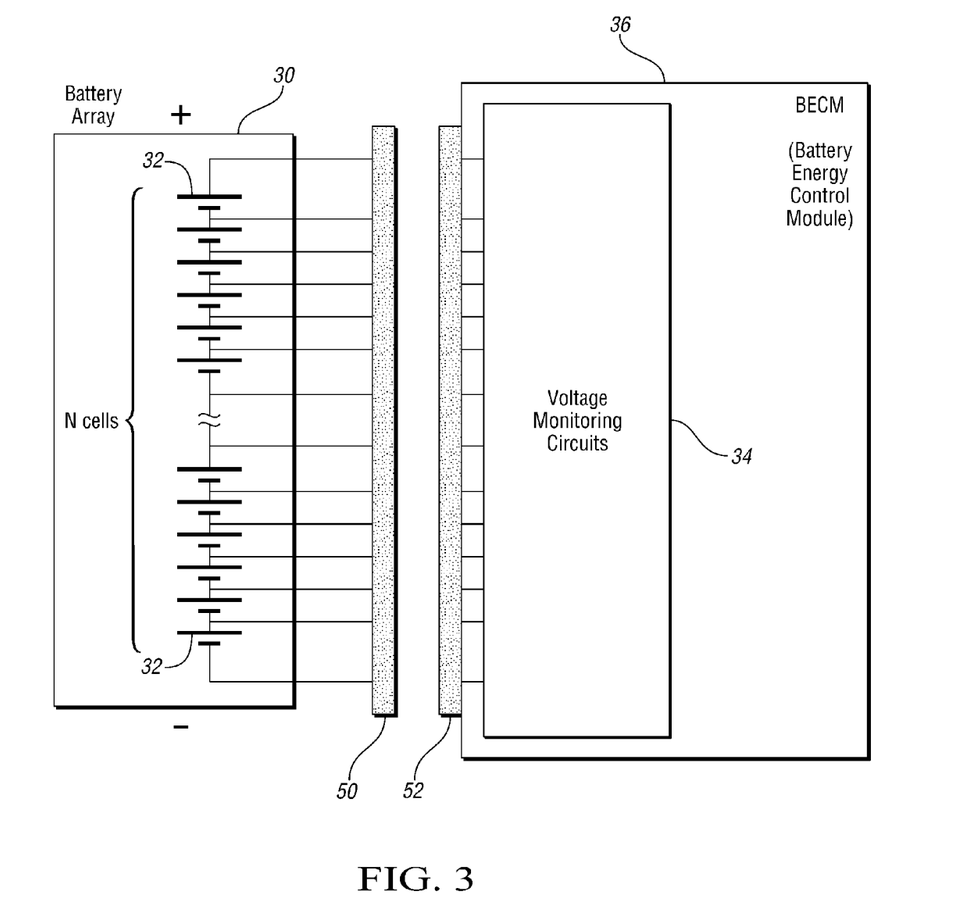
FIG. 3 is a diagram showing a battery array and a battery controller in a disconnected state.

FIG. 3 shows an unconnected battery connector 50. In this state, the battery-side connector 50 is not connected to the controller-side connector 52. In this case, there will be no power or voltages supplied to the voltage monitoring circuits 34 of the BECM 36.

During an ideal connection, as the battery-side connector 50 and the controller-side connector 52 are mated, all connections will be made at the same time. Each battery cell 32 will be electrically connected to the corresponding voltage monitoring circuit 34 element at the exact same time. Under ideal timing, all voltages within the voltage monitoring circuit 34 will begin to rise at the same time. In this ideal situation, the voltage differentials across measurement points in the voltage monitoring circuits 34 may be within designed levels. The voltage monitoring circuits 34 may be designed such that a limited range of values about the nominal cell voltage may be tolerated.

Figure 4:
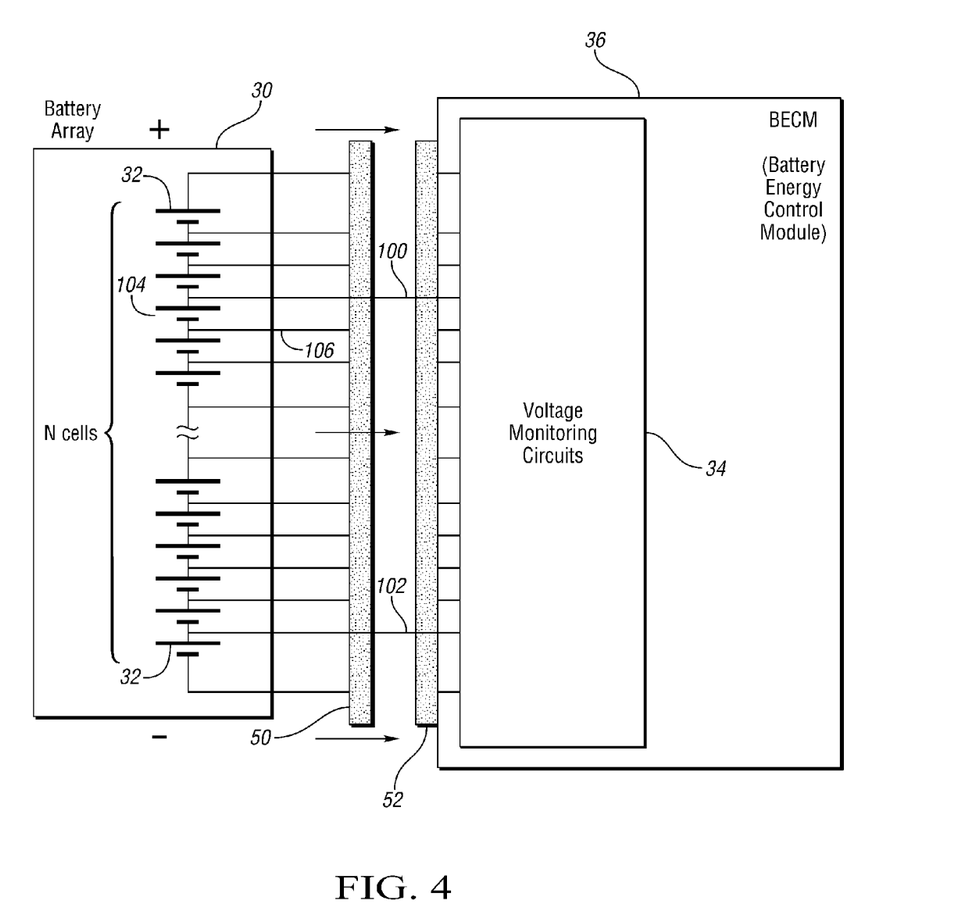
FIG. 4 is a diagram showing an example of two connections of a connector making contact before other connections.

The present disclosure recognizes that in practice, an ideal connection may not be repeatedly performed for many reasons. FIG. 4 shows an example of the connectors (50 and 52) in the process of being connected. During the connection process, some pins of the battery-side connector 50 and the controller-side connector 52 may make contact before other pins. For example, two connections (100 and 102) are shown as being made before any other connections. In the event of an incomplete connection, an input of the voltage monitoring circuit 34 may experience a higher voltage, reverse bias, or other transient condition which may lead to immediately detectable or latent damage to the BECM 36. The voltage on the input circuits may momentarily be unevenly distributed due to capacitive effects or variations in input impedance until all the pins are fully seated. It is possible that the full voltage potential between connecting pins is momentarily applied on other pins causing an overvoltage stress condition. The full potential of many cells may momentarily be unevenly distributed among a few module inputs.

For example, during simultaneous connection of all pins, the voltage across a battery cell 104 as measured at corresponding pins of the controller-side connector 52 will be the cell voltage. If only one terminal 100 of the battery cell 104 is connected to the controller-side connector 52, the voltage at the corresponding pin may be higher than the nominal cell voltage. The voltage at the connected BECM terminal 100 may be the sum of the battery cell voltages between the two connected pins (100 and 102). This may be considerably higher than the normal battery cell voltage across the battery cell (100 and 106). Depending on the pins that connect first, damaging voltages may be present across some components of the voltage monitoring circuit 34.

Additionally, each connection of the battery connector 50 may result in a different combination of connections during the connection process due to variations in pin length, seating depth, and connector insertion/extraction angle. Since each connection may be different, potentially damaging connections may not be repeatable and therefore may not be observed during normal manual testing.

Figure 5:
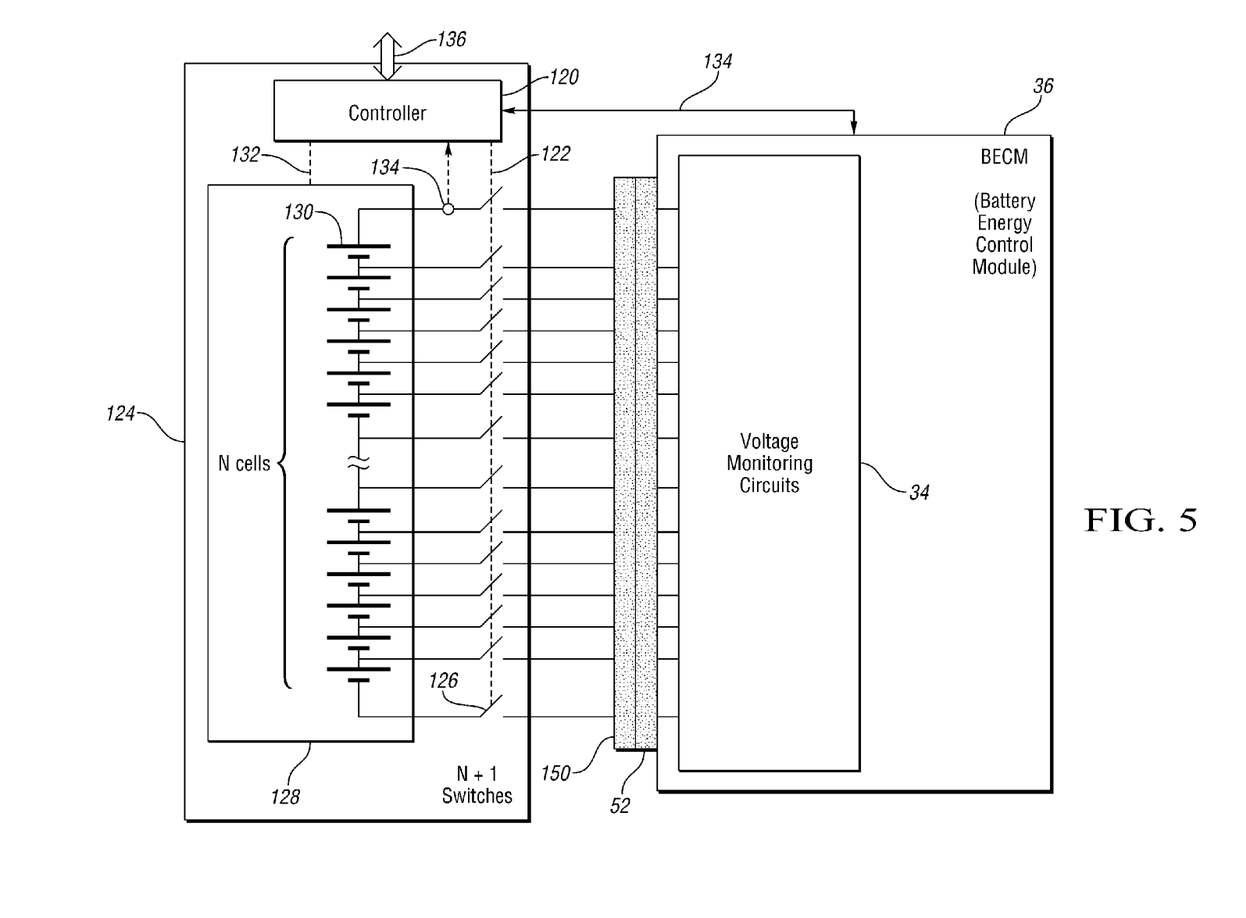
FIG. 5 is a diagram of an example of a battery connection simulator.

FIG. 5 shows a system for automated testing of a battery controller of one embodiment of the disclosure. A battery connection simulator 124 may be connected to a battery controller or BECM 36. The battery connection simulator 124 may include a battery cell voltage simulator 128. The battery cell voltage simulator 128 may be comprised of a number of power supplies 130 connected in series. Alternatively, a single power supply may be used with associated circuitry and/or electronic components to provide similar characteristics of a multiple cell traction battery. The power supply or supplies 130 may simulate the N cells of a battery pack. An individual power supply or battery cell simulator circuitry 130 may have two terminals, a positive terminal and a negative terminal. The positive and negative terminals may be defined such that when measuring the voltage across a power supply 130, the positive terminal is at a higher voltage than the negative terminal. The power supplies 130 may be connected such that the positive terminal of one power supply is connected to the negative terminal of another power supply 130. An output connection of the battery cell voltage simulator 128 may be electrically connected to the point where two power supplies 130 are connected. Represented in the battery cell voltage simulator 128 output may be at least one connection to every power supply terminal. Where two power supply 130 terminals are connected, only one connection may be output from the battery cell voltage simulator 128 to pins of the connector 150.

The power supplies 130 may operate at a fixed voltage. The power supplies 130 may draw power from a power source (e.g., utility power) and generate a voltage across the terminals of the power supply 130. The power supplies 130 are represented graphically in FIG. 5 as batteries. The power supplies 130 may also have an adjustable voltage output. The power supplies 130 may be capable of achieving a range of voltages to simulate a given battery pack configuration. Having an adjustable voltage range allows different types of batteries to be tested without having to make physical alterations to the testing apparatus. Multiple battery configurations and chemistries may be simulated by adjusting the voltage output. The output voltage of a programmable power supply 130 may be adjusted by a controller 120. Alternatively, the output voltages may be adjusted manually by the operator during system set-up. For testing a battery pack consisting of N cells, there may be N programmable power supplies 130 connected in series.

The battery connection simulator 124 may further comprise of a series of switches or switching devices 126 between each power supply 130 terminal and a corresponding recess or pin of a simulator-side connector 150. Each terminal of the power supplies 130 may be selectively connected to the voltage monitoring circuits 34 of the controller under test 36 when the simulator-side connector 150 is connected to the controller-side connector 52. The corresponding switching devices 126 allow each possible connection between the battery cell voltage simulator 128 and the BECM under test 36 to be selectively connected or disconnected. The switching devices 126 may be relays or solid-state switching devices. For testing a battery pack consisting of N cells, there may be N+1 switching devices for selectively connecting the power supplies to the controller 36.

For purposes of this disclosure, a power supply 130 may be considered connected to the battery controller 36 when either terminal of the corresponding power supply or battery cell simulator circuitry is connected to the battery controller 36. The battery cell voltage simulator 128 may be capable of simulating the cell voltages of each cell of a battery without the need for recharging or maintaining a battery pack. The battery connection simulator 124 may provide a connector 150 that is similar to the battery-side connector (50 FIG. 4) for mating with the controller-side connector 52 of the BECM 36 under test.

The battery connection simulator 124 may also include a controller 120 for activating and controlling the switching devices 126. The controller 120 may have a number of control outputs 122 that are capable of activating each of the switching devices 126. For example, for a system having M relays, the controller 120 may have M outputs that are capable of driving a relay coil. The control outputs 122 are represented in FIG. 5 as a dotted line connected to all of the switching devices 126 which may represent a separate control signal for each individual switching device 126. In addition, the controller 120 may be capable of receiving feedback signals for ascertaining the status of the switching devices 126. For example, a current sensor 134 may be present in each connection path for measuring the current through each pin. As another example, a signal representing the voltage across the switching device 126 may be sent to the controller 120 for each switching device. The controller 120 may also communicate with the BECM 36 under test. This communication may be via a Controller Area Network (CAN) connection shared between the controller 120 and the BECM 36 under test.

When adjustable power supplies 130 are used, the controller 120 may communicate with battery cell voltage simulator 128 to set the voltage output level of the programmable power supplies 130. The controller 120 may be able to turn the power supplies 130 on and off by sending the appropriate control signals 132. The controller 120 may be able to set the voltage output of each programmable power supply 130 individually such that one or more programmable power supplies have a different voltage than others. The communication may be via a serial communications bus or discrete inputs. The control signals 132 depend on the adjustable power supplies 130 and may represent a single serial communication line or a discrete line for each power supply 130.

The controller 120 may be contained within the battery connection simulator 124 or may be an external computing device or system. The controller 120 may be programmed to operate the switching devices 126 in a specified sequence operating two or more switching devices 126 in various combinations depending on the particular application and implementation. The controller 120 may store or log the input and output data in memory or on a non-volatile storage medium. Input data may include the time and the desired state of the switches at a given time. The input data may indicate a sequence of switching device patterns to apply. Input data may also include a number of times to repeat the sequence. Output data may include data collected from the BECM 36 under test and may include the voltage across each cell and the current through each cell. The data may be logged and stored for later analysis. The controller 120 may have a communications link 136 for communicating with other computing devices. The controller 120 may communicate test results and data over the communications link 136. The controller 120 may also receive input data over the communications link 136.

The controller 120 may be programmed to detect anomalous voltage and current readings from the BECM 36 under test. When a component in the battery controller 36 is damaged, the voltage and current readings may fall outside of an expected range of values. The controller 120 may compare the data received from the BECM 36 under test to expected values. For example, the expected values may be a range of voltages or currents that occur under normal conditions. Voltages or current readings that exceed certain limits may indicate that one or more components within the controller 36 have been damaged. Once such a condition is detected, the controller 120 may log a diagnostic code or status indication.

Figure 6:
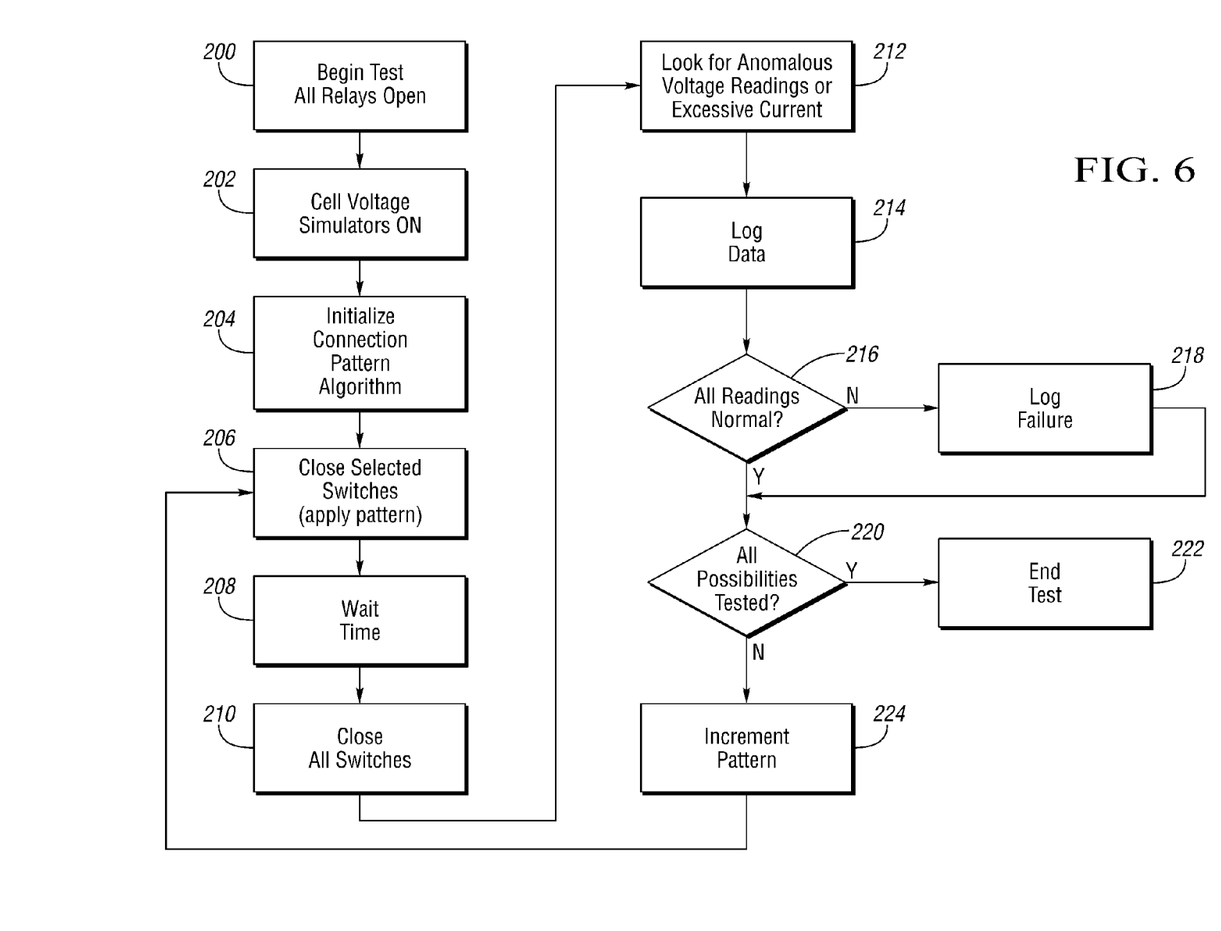
FIG. 6 is a flowchart of a possible sequence of testing connections between a battery simulator and a battery controller.

FIG. 6 shows a flowchart of an example of logic that may be implemented in a controller 120. A testing sequence may begin with all of the switching devices 126 being commanded to open state 200. The controller 120 may send signals to the battery connection simulator 124 to control all of the switching devices 126 to an open position such that all power supply voltages are disconnected from the pins of the BECM under test 36.

The next step may be to command the traction battery cell voltage simulators 130 to turn on so that voltage is present 202 at the terminals of each voltage simulator 130. Additionally, the output voltage of adjustable power supplies or associated circuitry 130 may be set to a desired voltage. The connection pattern algorithm may then be initialized 204. The connection pattern algorithm may be a defined sequence of switch closures or may be randomized. The connection pattern algorithm may be constructed so as to try all possible combinations of switch activations or may choose a subset of connection patterns that are deemed to be the most stressful based on the particular application. Connection patterns may connect individual inputs or pins in sequence, and/or sequential combinations of two or more pins, etc.

The controller 120 may then command selected switching devices 126 (e.g., relays) to close to apply the connection pattern to the controller 206. Closing less than all of the switches 126 simulates the connection of a battery pack to the BECM 36. The system may wait in this condition for a period of time 208 to simulate the transient condition. The waiting time may be a function of the specific circuitry used for the voltage monitoring circuits 34. A time long enough to allow the voltages to stabilize may be programmed. For example, a waiting time of one millesecond may be applied to allow voltages to settle after the initial connection. After the waiting period, all switching devices 126 may be closed 210 to connect all of the pins. Alternatively, the system may continue to test various combinations of inputs to complete a programmed testing sequence that terminates with all inputs 210 connected to power. As described below, each cycle or test may apply power to a predetermined combination of inputs 206 followed by applying power to all inputs 210.

Once all the switching devices 126 have been closed, the controller 120 may check voltages and currents of the system. After closing all of the switching devices 126, the voltages and currents may be measured and recorded by the controller 120. During the sequence of closing the switching devices 126, voltages and currents may also be measured and recorded by the controller 120 to observe any transient effects. The voltage and current readings may come from the BECM under test 36. Additionally, the controller 120 may interface with sensors for reading voltage and currents from the battery connection simulator 124. After closing all of the switching devices 126, the controller 120 may analyze the voltage and current readings for anomalous voltage readings or excessive currents 212. The data may be logged to a non-volatile storage medium for later review 214. The voltages and currents may be compared to normally expected values 216. During normal operation the voltages and currents measured by the controller 120 and BECM 36 should be within a predetermined range of the nominal voltage values of the power supply 130. Any voltage or current values outside of the predetermined range may indicate that damage has occurred in the BECM 36 circuitry. If any voltage or current readings are outside of the predetermined range, a status code may be logged to indicate a possible problem 218.

The logic may check to see if other connection possibilities remain to be tested 220. If there are no more test patterns, then the test may be ended 222. If there are more test patterns, then the next test pattern may be selected 224. The controller may then repeat the process described for each test pattern. The complete test may be repeated to determine cumulative stress effects until a failure occurs. A user may configure the controller 120 to repeat the testing as much as possible. The user may configure the controller 120 with specific connection patterns to assess damage due to different connection timings.

While the previously described embodiment focused on testing the battery controller 36 while connecting a battery pack to the battery controller 36, various embodiments may also include similar testing for disconnecting the battery controller 36 from the battery pack. The system may begin in a state where all of the switching devices 126 are in a closed position such that normal voltages are applied to each connection. One or more switching devices 126 may then be opened based on a programmed testing sequence for a predetermined period of time before the rest of the switching devices 126 are opened. A typical test case may be to disconnect all but two power supplies 130 or similar traction battery cell simulator circuits, leaving voltage on two pin connections for a predetermined period of time. After all switches 126 are opened, the battery controller 36 should measure voltages of approximately zero volts. In order to assess any damage, all the switching devices 126 may be closed to apply power to the voltage monitoring circuits 34. After a predetermined delay time, all switching devices 126 may be closed. Voltage and current data may then be monitored by the controller 120 to assess any damage similar to the strategy described above for the connecting case.

The battery connection simulator 124 may be used in a laboratory testing environment during all phases of battery system development. It is also conceivable that the battery connection simulator 124 may be placed in a vehicle environment for testing connections within a vehicle in some situations.

Use of the battery connection simulator may provide useful information for battery controller design. Worst case connection patterns may be identified and the controller design may be altered to prevent damage and improve robustness. The battery connection simulator may provide an indication as to whether or not a particular battery controller design is robust to typical connection issues that may arise in the field. The battery connection simulator allows a battery controller and connection system to be tested for connecting and disconnecting.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A traction battery connection simulator comprising:
    a plurality of power supplies connected to simulate battery cells of a multiple-cell traction battery;
    a plurality of switching devices that selectively connect the plurality of power supplies to a controller under test; and
    at least one controller programmed to operate the plurality of switching devices to selectively connect at least one of the plurality of power supplies to the controller under test for a predetermined period of time before connecting remaining power supplies of the plurality of power supplies to the controller under test.

2. The traction battery connection simulator of claim 1 wherein the at least one controller is further programmed to compare voltages associated with each of the power supplies and currents through each of the switching devices to corresponding predetermined ranges.

3. The traction battery connection simulator of claim 2 wherein the at least one controller is further programmed to communicate with the controller under test to receive voltage data that are voltage measurements associated with each of the power supplies.

4. The traction battery connection simulator of claim 2 further comprising a plurality of current sensors for measuring a current passing through each of the plurality of switching devices, wherein the at least one controller is further programmed to measure current data from the plurality of current sensors.

5. The traction battery connection simulator of claim 1 wherein the at least one controller is further programmed to, when all of the plurality of power supplies are connected to the controller under test, operate the plurality of switching devices so that at least one of the plurality of power supplies is not selectively connected for another predetermined period of time before operating the plurality of switching devices such that none of the plurality of power supplies are connected.

6. The traction battery connection simulator of claim 1 wherein two of the plurality of power supplies are connected for the predetermined period of time.

7. The traction battery connection simulator of claim 1 wherein the plurality of power supplies have an output voltage that is adjustable.

8. A method for testing a controller comprising:
    connecting at least one of a plurality of power supplies that simulate battery cells of a multiple-cell traction battery to the controller for a predetermined time using a programmed controller;
    connecting, after the predetermined time, remaining power supplies of the plurality of power supplies to the controller using the programmed controller; and
    comparing voltages and currents associated with each of the power supplies to corresponding predetermined ranges.

9. The method of claim 8 wherein connecting the plurality of power supplies comprises controlling corresponding switching devices using the programmed controller.

10. The method of claim 8 wherein voltage data associated with each of the power supplies is received from the controller.

11. The method of claim 8 wherein, for the predetermined time, two of the plurality of power supplies are connected.

12. The method of claim 8 further comprising setting an indicator in response to at least one of the voltages and currents being outside of a corresponding predetermined range.

13. The method of claim 8 further comprising (i) connecting all of the plurality of power supplies to the controller, (ii) disconnecting at least one of the plurality of power supplies from the controller for another predetermined time and (iii) disconnecting remaining power supplies of the plurality of power supplies after the another predetermined time, using the programmed controller.

14. A traction battery connection simulator comprising:
at least one power supply connected to simulate battery cells of a multiple-cell traction battery;
a plurality of switching devices that selectively apply power from the power supply to combinations of pins of a connector electrically coupled to a controller under test; and
at least one controller programmed to operate the plurality of switching devices to connect power to at least one of the pins of the connector for a predetermined period of time before connecting power from the power supply to remaining pins of the connector.

15. The traction battery connection simulator of claim 14 wherein the at least one controller is further programmed to connect power from the power supply to various combinations of pins associated with the controller under test.

16. The traction battery connection simulator of claim 15 wherein the at least one controller is further programmed to compare voltages and currents associated with the combinations to corresponding predetermined ranges.

17. the traction battery connection simulator of claim 14 wherein the at least one controller is further programmed to, after operating the plurality of switching devices to connect power to all pins of the connector, operate the switching devices to selectively disconnect power to various combinations of pins connected to the controller under test for another predetermined period of time before disconnecting power to all pins.

* * * * *